(12) United States Patent
Chen et al.

(10) Patent No.: US 7,965,577 B2
(45) Date of Patent: Jun. 21, 2011

(54) WORD LINE DEFECT DETECTING DEVICE AND METHOD THEREOF

(75) Inventors: Wei-Jen Chen, Kaohsiung County (TW); Ho-Yin Chen, Hsinchu County (TW); Lien-Sheng Yang, Hsinchu (TW); Shu-Jen Wu, Kinmen County (TW)

(73) Assignee: Etron Technology, Inc., Hsinchu (TW)

( * ) Notice: Subject to any disclaimer, the term of this patent is extended or adjusted under 35 U.S.C. 154(b) by 203 days.

(21) Appl. No.: 12/543,491

(22) Filed: Aug. 18, 2009

(65) Prior Publication Data

US 2010/0329052 A1   Dec. 30, 2010

(30) Foreign Application Priority Data

Jun. 26, 2009   (TW) .............................. 98121613 A

(51) Int. Cl.
*G11C 8/00* (2006.01)
(52) U.S. Cl. .............................. 365/230.06; 365/189.07
(58) Field of Classification Search ............ 365/230.06, 365/189.07
See application file for complete search history.

(56) References Cited

U.S. PATENT DOCUMENTS

| 6,023,434 | A  | * | 2/2000 | Shore et al. ................. 365/201 |
| 7,020,039 | B2 | * | 3/2006 | Tran et al. ................... 365/222 |
| 7,366,051 | B2 | * | 4/2008 | Ueda ....................... 365/230.06 |
| 7,486,587 | B2 | * | 2/2009 | Scheuerlein et al. .... 365/230.06 |

* cited by examiner

*Primary Examiner* — Son T Dinh
(74) *Attorney, Agent, or Firm* — Winston Hsu; Scott Margo

(57) ABSTRACT

Method for detecting word line defect includes activating a first word line for reading a first data pre-stored in the memory cell, suspending the first word line for a predetermined period and then writing a second data complementary to the first data into the memory cell, activating again the first word line for reading a third data from the memory cell, and comparing the second and the third data for determining if an electrical coupling path exists between the first word line and a second word line.

6 Claims, 2 Drawing Sheets

WORD LINE DEFECT DETECTING DEVICE AND METHOD THEREOF

BACKGROUND OF THE INVENTION

1. Field of the Invention

The present invention relates to a word line defect detecting device, and more particularly, to a detecting device for determining if a word line is short-circuited with other word lines.

2. Description of the Prior Art

In the memory, the data can be stored through a word line and a bit line into a corresponding memory cell. However, when a first word line is short-circuited with a second word line, if a data is to be written into a first memory cell corresponding to the first word line, the data is simultaneously written into a second memory cell corresponding to the second word line. In this way, the data pre-stored in the second memory cell is damaged. Therefore, an incorrect data is obtained when the second memory cell is read, causing a great inconvenience.

SUMMARY OF THE INVENTION

The present invention provides a word line detecting device. The detecting device comprises a first word line, a second word line, and a controller. The first word line is coupled to at least a memory cell. The second word line is disposed adjacent to the first word line. The controller is coupled to the first word line and the second word line. The controller activates the first word line for reading a first data pre-stored in the memory cell. Then the controller suspends the first word line for a predetermined period. Then the controller writes a second data complementary to the first data into the memory cell. Then the controller activates the first word line again for reading a third data from the memory cell and compares the third data with the second data for determining if an electrical coupling path exists between the first word line and the second word line.

The present invention further provides a method for detecting word line defect, wherein a memory cell is coupled to a first word line and the first word line is adjacent to a second word line. The method comprises (a) activating the first word line for reading a first data pre-stored in the memory cell, (b) suspending the first word line for a predetermined period and then writing a second data complementary to the first data into the memory cell, (c) activating again the first word line for reading a third data from the memory cell, and (d) comparing the second and the third data for determining if an electrical coupling path exists between the first word line and the second word line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
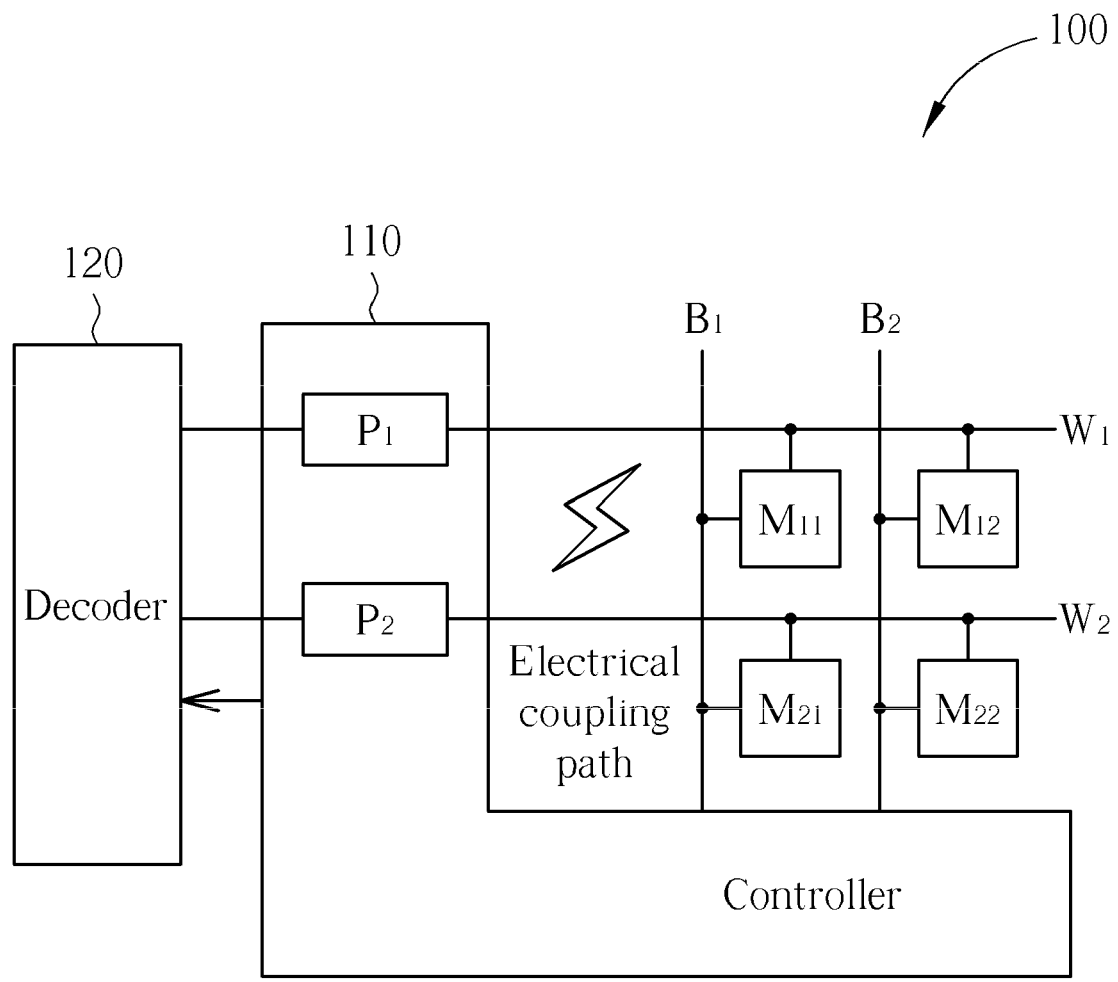
FIG. 1 is a diagram illustrating a word line defect detecting device of the present invention.

Please refer to FIG. 1. FIG. 1 is a diagram illustrating a word line defect detecting device 100 of the present invention. The detecting device 100 comprises a controller 110, a decoder 120, two drivers $P_1$ and $P_2$, two word lines $W_1$ and $W_2$, and two bit lines $B_1$ and $B_2$, wherein the word line $W_1$ is adjacent to the word line $W_2$.

The memory cells $M_{11}$ and $M_{12}$ are both coupled to the word line $W_1$, and respectively coupled to the bit lines $B_1$ and $B_2$; the memory cells $M_{21}$ and $M_{22}$ are both coupled to the word line $W_2$, and respectively coupled to the bit lines $B_1$ and $B_2$.

Figure 2:
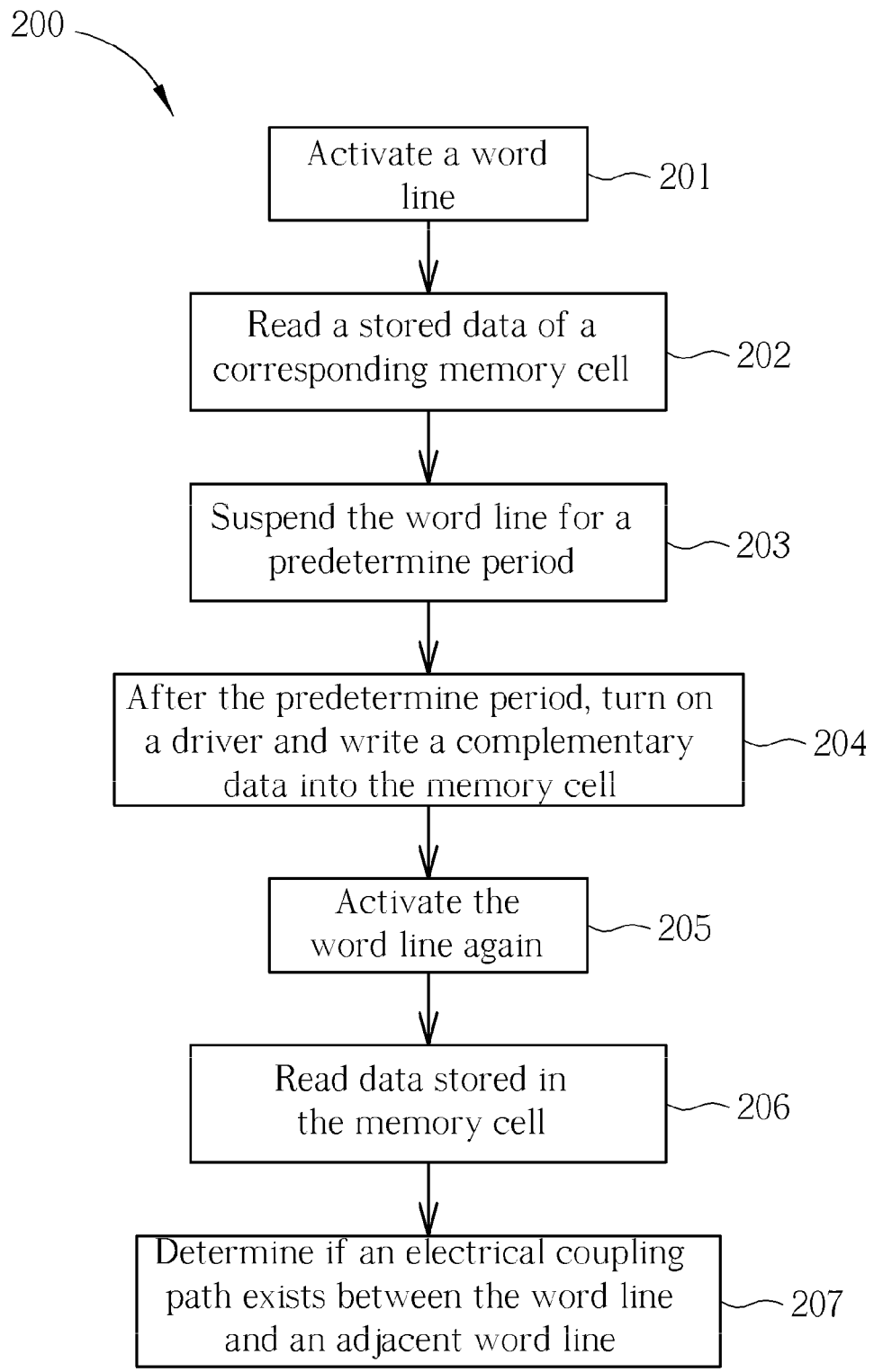
FIG. 2 is a flowchart illustrating a method for detecting word line defects of the present invention.

Please refer to FIG. 2. FIG. 2 is a flowchart illustrating a method 200 for detecting word line defects of the present invention. Assuming that the detecting device 100 is to determine if the word line $W_1$ has a defect, which means that the detecting device 100 is to determine if an electrical coupling path exists between the word lines $W_1$ and $W_2$, the detecting device 100 executes the procedures of FIG. 2, which are illustrated in detail as follow:

step 201: the controller 110 controls the decoder 120 and the driver $P_1$ to activate the word line $W_1$, and simultaneously to keep the word line $W_2$ deactivated;

step 202: the controller 110 read data $D_1$ stored in the memory cell $M_{11}$ through the corresponding bit line $B_1$;

step 203: the controller 110 turns off the decoder 120 and the driver $P_1$ for a predetermined period $T_P$ for suspending the word line $W_1$;

step 204: after the predetermined period $T_P$, the controller 110 turns on the driver $P_1$ (the decoder 120 still remains turned-off) for writing a data $D_2$, which is complementary to the data $D_1$, into the memory cell $M_{11}$ through the bit line $B_1$;

step 205: the controller 110 controls the decoder 120 and the driver $P_1$ to activate the word line $W_1$ again;

step 206: the controller 110 reads a data $D_3$ stored in the memory cell $M_{11}$ through the bit line $B_1$;

step 207: the controller 110 determines if an electrical coupling path exists between the word lines $W_1$ and $W_2$ according to the data $D_1$ and $D_3$.

A word line is activated or deactivated by means of the decoder 120 and the driver corresponding to the word line. For instance, if the word line $W_1$ is to be activated, the decoder 120 has to send a signal representing "activating" to the driver $P_1$ for activating the word line $W_1$; otherwise, if the word line is to be deactivated, the decoder 120 has to send a signal representing "deactivating" to the driver $P_2$ for deactivating the word line $W_2$. In addition, the activated word line $W_1$ and the deactivated word line $W_2$ are driven respectively to a activating voltage level $V_{ACT}$ and a deactivating voltage level $V_{DEACT}$. For example, assume the activating voltage level $V_{ACT}$ is a high voltage level (for example, 5 volts), and the deactivating voltage level $V_{DEACT}$ is a low voltage level (for example, 0 volt). In this way, when the word line $W_1$ is activated, the voltage level of the word line $W_1$ is 5 volts; when the word line $W_2$ is deactivated, the voltage level of the word line $W_2$ is 0 volt. Or, assume the activating voltage level $V_{ACT}$ is a low voltage level (for example, 0 volt), and the deactivating voltage level $V_{DEACT}$ is a high voltage level (for example, 5 volts). In this way, when the word line $W_1$ is activated, the voltage level of the word line $W_1$ is 0 volt; when the word line $W_2$ is deactivated, the voltage level of the word line $W_2$ is 5 volts. A threshold voltage level $V_{TH}$ is predetermined between the activating voltage level $V_{ACT}$ and the deactivating voltage level $V_{DEACT}$. When the voltage level of a word line is between the activating voltage level $V_{ACT}$ and the threshold voltage level $V_{TH}$, the memory cells corresponding to the word line can be written or read through the corresponding bit lines; otherwise, When the voltage level of a word line is between the deactivating voltage level $V_{DEACT}$ and the threshold voltage level $V_{TH}$, the memory cells corresponding to the word line can not be written or read through the corresponding bit lines. Hereinafter, assume the activating voltage level $V_{ACT}$ is 5 volts, the deactivating voltage level $V_{DEACT}$ is 0 volt, and the threshold voltage level $V_{TH}$ is 3 volts.

In the step 201, activating the word lines means the voltage level of the word line $W_1$ is driven to 5 volts ($V_{ACT}$), and deactivating the word line $W_2$ means the voltage level of the word line $W_2$ is driven to 0 volt ($V_{DEACT}$).

In the step 202, since the word line $W_1$ is already activated, the memory cell $M_{11}$ can transmit the stored data $D_1$ to the controller 110 through the bit line $B_1$.

In the step 203, the controller 110 turns off the decoder 120 and the driver $P_1$ so as to suspend the word line $W_1$. Since the word line $W_1$ is activated previously and the word line $W_2$ is deactivated previously, the voltage levels of the word lines $W_1$ and $W_2$ are 5 volts and 0 volt, respectively. As the above-mentioned, the condition of the memory cell $M_{11}$ capable of being written or read is that the voltage level of the word line $W_1$ is higher than 3 volts (threshold voltage level $V_{TH}$). If an electrical coupling path exists between the word lines $W_1$ and $W_2$, the voltage level of the word line $W_1$ are lowered down because of the leakage to the word line through the electrical coupling path. As a result, in the step 203, the objective of suspending the word line $W_1$ for the predetermine period $T_P$ is to detect if an electrical coupling path exists between the word lines $W_1$ and $W_2$. In other words, if there is no electrical coupling path between the word lines $W_1$ and $W_2$, then after the step 203, the voltage level of the word line $W_1$ can still remain 5 volts so that the memory cell $M_{11}$ can be written or read; if there is an electrical coupling path between the word lines $W_1$ and $W_2$, then after the step 203, the voltage level of the word line $W_1$ is lowered down so that the memory cell $M_{11}$ can not be written or read.

In the step 204, after the predetermined period $T_P$, the controller 110 turns on the driver $P_1$ and writes the data $D_2$ complementary to the data $D_1$ into the memory cell $M_{11}$. That is, if the data $D_1$ is logic "1", the data $D_2$ is logic "0"; if the data $D_1$ is logic "0", the data $D_2$ is logic "1". Since the decoder 120 still remains turned-off at the time, the word line $W_1$ is not be activated again (that is, the voltage level of the word line $W_1$ is not driven to 5 volts). In this way, if an electrical coupling path exists between the word lines $W_1$ and $W_2$, the data $D_2$ can not be written into the memory cell $M_{11}$; if no electrical coupling path exists between the word lines $W_1$ and $W_2$, the data $D_2$ can be written into the memory cell $M_{11}$ through the bit line $B_1$. More particularly, if an electrical coupling path exists between the word lines $W_1$ and $W_2$, after the step 204, the stored data of the memory cell $M_{11}$ still remains the previously stored data $D_1$; if no electrical coupling path exists between the word lines $W_1$ and $W_2$, the stored data of the memory cell $M_{11}$ becomes the data $D_2$.

In the step 205, the controller 110 turns on the decoder 120 and the driver $P_1$, and activates the word line $W_1$ again. That is, in the step 205, the voltage level of the word line $W_1$ is driven to 5 volts again. In this way, in the step 206, the controller 110 can read the data $D_3$ stored in the memory cell $M_{11}$ through the bit line $B_1$.

In step 207, the controller 110 compares the data $D_3$ read in the step 206 and the data $D_1$ read in the step 202 for determining if an electrical coupling path exists between the word lines $W_1$ and $W_2$. More particularly, in the step 204, the controller 110 writes the data $D_2$ complementary to the data $D_1$. Thus, if the data $D_2$ is written successfully in the step 204, the data $D_3$ read in the step 207 is data $D_2$; if the data $D_2$ is written unsuccessfully in the step 204, the data $D_3$ read in the step 207 is data $D_1$. Hence, the controller 110 can determine if an electrical coupling path exists between the word lines $W_1$ and $W_2$ by means of comparing the data $D_3$ and $D_1$. More precisely, if the data $D_3$ is complementary to the data $D_1$, it represents the data $D_2$ is written successfully in the step 204. Therefore, the controller 110 can determine no electrical coupling path between the word lines $W_1$ and $W_2$; if the data $D_3$ is equal to the data $D_1$, it represents the data $D_2$ is written unsuccessfully in the step 204. Therefore, the controller 110 can determine an electrical coupling path between the word lines $W_1$ and $W_2$, and accordingly determine the word line $W_1$ has a defect.

In conclusion, the detecting device provided by the present invention can detect if an electrical coupling path exists between two adjacent word lines by means of suspending one of the word lines for a predetermined period and then writing a complementary data into the word line. In this way, the word lines having defects can be efficiently determined, providing a great convenience.

Those skilled in the art will readily observe that numerous modifications and alterations of the device and method may be made while retaining the teachings of the invention.

What is claimed is:

1. A word line detecting device, comprising:
   a first word line, coupled to at least a memory cell;
   a second word line, disposed adjacent to the first word line; and
   a controller, coupled to the first word line and the second word line, the controller activating the first word line for reading a first data pre-stored in the memory cell, then the controller suspending the first word line for a predetermined period, then the controller writing a second data complementary to the first data into the memory cell, then the controller activating the first word line again for reading a third data from the memory cell and comparing the third data with the second data for determining if an electrical coupling path exists between the first word line and the second word line.

2. The word line detecting device of claim 1, wherein when the second data is different from the third data, the controller determines that the electrical coupling path exists between the first word line and the second word line.

3. The word line detecting device of claim 1, wherein the controller comprises:
   a first driver, corresponding to the first word line and a decoder, the decoder coupled to the first word line and the second word line, the controller turning off the first driver and the decoder for suspending the first word line, and the controller turning on the first driver for writing into the second data into the memory cell when the decoder is turned-off.

4. A method for detecting word line defect, wherein a memory cell is coupled to a first word line and the first word line is adjacent to a second word line, the method comprising:
   (a) activating the first word line for reading a first data pre-stored in the memory cell;
   (b) suspending the first word line for a predetermined period and then writing a second data complementary to the first data into the memory cell;
   (c) activating again the first word line for reading a third data from the memory cell; and
   (d) comparing the second and the third data for determining if an electrical coupling path exists between the first word line and the second word line.

5. The method of claim 4, wherein when the second data is different from the third data, the electrical coupling path is determined to exist between the first word line and the second word line.

6. The method of claim 4, wherein a first driver is corresponding to the first word line and a decoder is coupled to the first word line and the second word line, the step (b) comprising:

(b1) turning off the first driver and the decoder for suspending the first word line; and (b2) when the decoder is turned off, turning on the first driver for writing the second data into the memory cell.

* * * * *